US007135922B2

United States Patent
Zepp (10) Patent No.: US 7,135,922 B2
(45) Date of Patent: Nov. 14, 2006

(54) POWER SUPPLY REJECTION FOR PULSE WIDTH MODULATED AMPLIFIERS AND AUTOMATIC GAIN CONTROL

(75) Inventor: David Zepp, Milford, PA (US)

(73) Assignee: Altec Lansing Technologies, Inc., Milford, PA (US)

( * ) Notice: Subject to any disclaimer, the term of this patent is extended or adjusted under 35 U.S.C. 154(b) by 0 days.

(21) Appl. No.: 11/030,318

(22) Filed: Jan. 7, 2005

(65) Prior Publication Data

US 2005/0179489 A1    Aug. 18, 2005

Related U.S. Application Data

(60) Provisional application No. 60/535,134, filed on Jan. 7, 2004.

(51) Int. Cl.
  *H03F 3/217*    (2006.01)
(52) U.S. Cl. ................. 330/251; 330/10; 330/207 A
(58) Field of Classification Search ............. 330/10, 330/207 A, 251
  See application file for complete search history.

(56) References Cited

U.S. PATENT DOCUMENTS

| | | | |
|---|---|---|---|
| 6,384,678 B1 * | 5/2002 | Berkhout | 330/10 |
| 2005/0083115 A1 * | 4/2005 | Risbo | 330/10 |

OTHER PUBLICATIONS

"Technical Monograph 90-10-Power Supply Regulation," Valve Amplification Company (VAC) http://www.vac-amps.com/page0029.html, pp. 1-5.

W. Marshall Leach, Jr., Introduction to Electroacoustics and Audio Amplifier Design, 2$^{nd}$ ed. Revised Printing, © 2001, pp. 1-6.
"Gain" Wikipedia, http://en.wikipedia.org/wiki/Gain, Aug. 23, 2004, p. 1.
"Testing an A/D's Power Supply Rejection Ratio" CommsDesign Newsletter, http://www.commsdesign.com/design_corner/showArticle.jhtml?articleID=12804251, Jul. 11, 2003, pp. 1-4.
"Mosfet" http://en.wikipedia.org/wiki/MOSFET, pp. 1-3.
"Operational Amplifier" http://en-wikipedia.org/wiki/Operational_amplifier, pp. 1-9.
"Comparator" http://en-wikipedia.org/wiki/Comparator, p. 1.
"On-amp Varieties" http://hyperphysics.phy-astr.gsu.edu/hbase/electronic/opampvar8.html. pp. 1-2.
"Pulse-width Modulation" http://en.wikipedia.org/wiki/Pulse-width_modulation, p. 1.
"Pulse Width Modulation (PWM) Basics" http://www.powerdesigner.com/InfoWeb/design_center/articles/PWM/pwm.shtm, pp. 1-3.

(Continued)

*Primary Examiner*—Khanh Van Nguyen
(74) *Attorney, Agent, or Firm*—Adam B. Landa; Richard E. Kurtz; Greenberg Traurig, LLP (57) ABSTRACT

A circuit according to the present invention improves the power supply rejection ratio for a pulse width modulated digital amplifier and can be used as a compressor and/or limiter. The circuit preferably operates by using voltage level translation to vary the amplitude of a triangle wave in response to changes in power supply voltage prior to input of the wave into a comparator of the PWM device. Because the circuit operates to improve power supply rejection, little or no distortion is introduced into the signal when used as a compressor and/or limiter. Additionally, the circuit is optionally implemented in a Class D amplifier, and provides a lower cost of implementation than conventional designs in such implementations.

10 Claims, 6 Drawing Sheets

OTHER PUBLICATIONS

"Basic Car Audio Electronics" http://www.eatel.net/~amptech/elecdisc/ampclass.htm, pp. 1-9.

"A/D Converter Definition of Terms" National Semiconductor Corporation © 2000. Jan. 2000, 2 pgs.

"Opamp Calculations" http://www.euronet.nl/~mgw/background/opamps/uk_opampgain_1.html, Apr. 30, 2004, pp. 1-8.

"Improved Power Supply Rejection for IC Linear Regulators" Dallas Semiconductor Maxim, http://www.maxim-ic.com/appnotes.cfm/appnote_number/883, pp. 1-6.

Nicholas Gary "Power Supply Effects on Noise Performance" Application Brief, National Semiconductor, 2 pp.

Robert Zeff, "Anatomy of the Power Amplifier" Car Audio and Electronics, http://wwwcaraudiomag.com/specialfeatures/0111cae_anatomy/, pp. 1-8.

"Disclaimer" Power Amplifer Fundamental, http://www.rocketroberts.com/techart/amp.htm, Sep. 27, 2003, pp. 1-12.

* cited by examiner

POWER SUPPLY REJECTION FOR PULSE WIDTH MODULATED AMPLIFIERS AND AUTOMATIC GAIN CONTROL

CROSS-REFERENCE TO RELATED APPLICATIONS

This application claims priority to U.S. Provisional Patent Application Ser. No. 60/535,134, filed Jan. 7, 2004, which is hereby incorporated by reference in its entirety.

This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

BACKGROUND OF THE INVENTION

Class D amplifiers differ from conventional power amplifiers, such as Class A and Class B power amplifiers, in various respects. Conventional power amplifiers have an output voltage or current that is proportionally larger than its input. The output devices operate in the linear region, where the device is partially "on". As a result, much of the power that is supplied to the amplifier converts to heat and is not efficiently utilized. Larger power transformers are needed as well as larger heat sinks, which remove heat from the output devices.

Unlike the partially "on" power amplifiers, Class D amplifiers operate such that the output devices are either on or off. Because the devices are on or off, the devices convert less power to heat. As a result, a smaller heat sink and power transformer can be used. However, there are some limitations associated with Class D amplifiers.

Due to power supply rejection, Class D amplifiers may suffer from reduced dynamic range and operate non-linearly. The power supply rejection ratio ("PSRR") is the ratio of the change in output voltage of an amplifier to the change in power supply voltage, and can be expressed as 20*log (Voltage output change/Voltage supply change). In linear power supplies with a power transformer, as more current is consumed by the amplifier, the voltage provided by the power transformer is reduced. Class D amplifiers typically have a 0 dB PSRR. Any change in the power supply voltage is reflected directly at the output of the amplifier. If the power supply voltage is reduced by −6 dB for example, then the output signal will be reduced by −6 dB as well, reducing the dynamic range and causing non-linear operation. Dynamic range is the audio range from the lowest to the highest detectable volume signal output by the amplifier. If the reduction in the power rails reduces the highest level of amplifier output and maintains the level of the lowest signal, then the dynamic range is effectively reduced. As a result, the listener does not hear the louder passages as loud as intended, while the softer passages are produced as intended.

Audio power amplifiers are typically designed to drive loudspeakers. In subwoofer applications, it may be desirable to reduce the dynamic range under very controlled conditions using a compressor or limiter, which are types of automatic gain control circuits. A compressor changes the gain of an amplifier based on signal level. For example, an input of +6 dB into a compressor may result in an output of +3 dB when the signal is above a predetermined threshold. A limiter does not change the output with an increase of input signal, when the signal is above a set threshold. For example, an input of +6 dB into a limiter may result in no increase of signal on the output. Limiters and compressors can be expensive to implement. Most low cost compressor or limiter designs introduce harmonic distortion into the signal.

A conventional Class D audio amplifier as described in Motorola application note AN1042, "High Fidelity Switching Audio Amplifiers Using TMOS Power MOSFETs" by Donald E. Pauly, which is hereby incorporated by reference. The design for power supply correction implements costly transformers. Additionally, the Audio Engineering Society preprint numbers 4446 and 4673 discuss error correction using feedback techniques and patented feed forward correction. However, feedback alone does not give enough correction for power supply errors.

Pulse Width Modulation is a well-known technique for synthesizing a train of pulses in pulse-modulation-based power amplifiers. Several examples of pulse width modulation techniques are detailed in "A Review and Comparison of Pulse Width Modulation (PWM) Methods For Analog and Digital Input Switching Power Amplifiers" by Karsten Nielsen, which is incorporated herein by reference in its entirety. Further discussion of PWM can be found in "Comparing Nonlinear With Linear Control Methods for Error Correction in Switching Audio Amplifier Output Stages," by Thomas Taul, Karsten Nielsen, and Michael A. E. Andersen, which is hereby incorporated by reference. In one embodiment, the pulse width modulated digital amplifier may be a Class D amplifier.

SUMMARY OF THE INVENTION

A circuit according to the present invention improves the power supply rejection ratio for a pulse width modulated digital amplifier and can be used as a compressor and/or limiter, whether simultaneously or independently. The circuit preferably operates by using voltage level translation to vary the amplitude of a triangle wave in response to changes in power supply voltage prior to the input of the wave into a comparator of the PWM device. Because the circuit provides improved power supply rejection, little or no distortion is introduced into the signal when used as a compressor and/or limiter. The circuit may be implemented in a Class D amplifier. The cost of implementation is lower than conventional designs when used in conjunction with a Class D amplifier. Furthermore, the circuit is more efficient than conventional designs, so the power supply and transistor heat sinks can be smaller than in those conventional designs.

In one embodiment, a circuit for providing improved power supply rejection of a pulse width modulated digital amplifier includes a buffering mechanism that buffers divided reference voltages; an oscillator which outputs a first waveform, which can be combined with the divided reference voltages; a subcircuit that performs a voltage level translation, wherein the voltage level translation outputs a second waveform having a similar frequency to the first waveform and has an amplitude that varies between the divided reference voltages; and an integrator that converts the second waveform into a triangle waveform that can be used with the pulse width modulated digital amplifier. The pulse-width-modulated digital amplifier may be a Class D amplifier. The buffering mechanism is preferably an operational amplifier. The buffering mechanism ensures an accurate low-impedance voltage. The second waveform is a square waveform. The oscillator is a fixed oscillator. The first waveform has a 50% duty cycle. The divided reference voltages can include ground.

In another embodiment, a circuit useful as a compressor or limiter with a Class D amplifier comprises means for rectifying an audio input signal; means for DC amplifying the audio input signal; means for injecting the audio input signal into a circuit for providing improved power supply rejection, the circuit comprising a buffering mechanism that buffers divided reference voltages; an oscillator which outputs a first waveform, wherein the first waveform can be combined with the divided reference voltages; a subcircuit that performs a voltage level translation, wherein the voltage level translation outputs a second waveform having a similar frequency to the first waveform, wherein the second waveform has an amplitude that varies between the divided reference voltages; and an integrator that converts the second waveform into a triangle waveform that can be used with the pulse width modulated digital amplifier.

In yet another embodiment, a circuit useful as a compressor or limiter comprises means for rectifying an audio input signal; means for DC amplifying the audio input signal; means for injecting the audio input signal into a circuit for providing improved power supply rejection, the circuit comprising a buffering mechanism that buffers divided reference voltages; an oscillator which outputs a first waveform, wherein the first waveform can be combined with the divided reference voltages; a subcircuit that performs a voltage level translation, wherein the voltage level translation outputs a second waveform having a similar frequency to the first waveform, wherein the second waveform has an amplitude that varies between the divided reference voltages; an integrator that converts the second waveform into a triangle waveform that can be used with the pulse width modulated digital amplifier; means for inputting pulse-width-modulated signals to a differential amplifier; and a lowpass filter to restore audio to the output.

The foregoing and other objects, features, and advantages of the invention will be apparent from the following more particular description of preferred embodiments as illustrated in the accompanying drawings, in which reference characters refer to the same parts throughout the various views. The drawings are not necessarily to scale, emphasis instead being placed upon illustrating principles of the invention.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of at least one embodiment of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
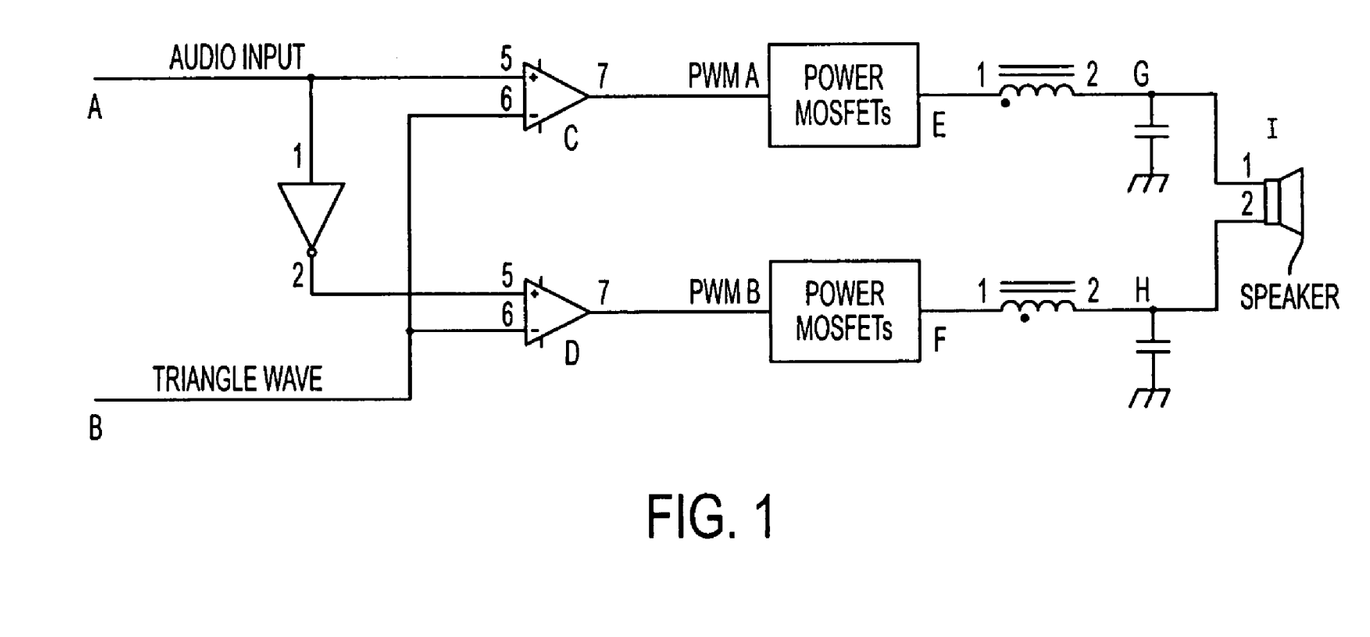
FIG. 1 illustrates the basic operation of a Class D amplifier.

With reference to FIG. 1, in the basic operation of a class D amplifier, an audio input signal (A) goes into a first comparator (C). The audio input signal is also inverted and then goes into a second comparator (D). A triangle wave (B) is input into both comparators. Within both comparators (C, D), the audio input signal is compared to the triangle wave. If the audio input signal is higher than the triangle wave, then the comparator output is high. If the audio input signal is lower than the triangle wave, then the comparator output is low. The comparators output pulse width modulated ("PWM") signals (PWM A, PWM B) that correlate to the audio input signal. The PWM signal is rectified in the power Metal-Oxide Semiconductor Field-Effect Transistors ("MOSFETs"), which have a PWM output that switches between the +/− voltage rails (E, F). First and second LC low pass filters (G, H) remove most of the switching signal and convert it back to audio. Since the audio is inverted before the second comparator (D), the second filter (H) output has an inverted signal as compared to the first filter (G) output. If the amplitude of the triangle wave is reduced by an amount, then the gain of the amplifier is increased by that same amount. For example, if the triangle wave is decreased by −6 dB, the amplifier gain is increased by +6 dB. Because the power MOSFETs switch between the +/− voltage supplies, a decrease of power supply voltage by −6 dB will decrease the audio output by −6 dB.

A desirable PSRR is obtained by compensating for a decrease of gain due to changes in power supply voltage by an equivalent increase of gain due to triangle wave amplitude reduction. In other words, if the amplifier output level is reduced because the power supply voltage is reduced, then the triangle wave level is reduced by the amount that the power supply voltage is reduced. The reduction of power supply causes the square wave to reduce its output because that output is set to be a ratio of the power supply voltage. The square wave is then converted into a triangle wave. In one embodiment, this approach allows more than one triangle wave to be generated by one square wave. Desirable PSRR is achieved because the amount of decrease in amplitude from the power supply voltage reduction equals the amount of increase caused by the triangle wave reduction.

Figure 2:
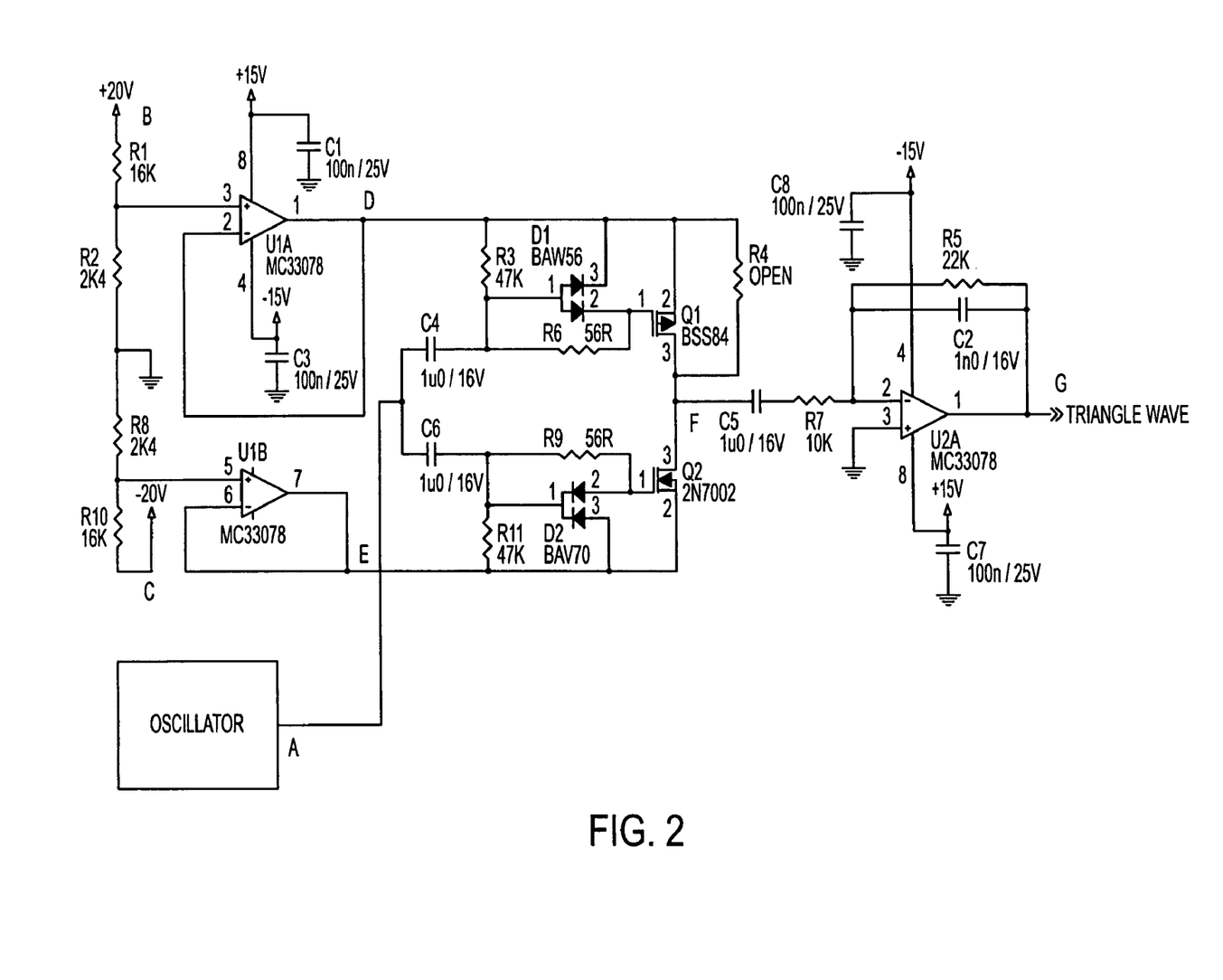
FIG. 2 is a circuit in an amplifier used for power supply rejection according to an embodiment of the present invention.

FIG. 2 illustrates a circuit that can be used for power supply rejection only, when the power supply has +/− DC voltages. The circuit connects to the unregulated power supply of the amplifier at points B, C and all op-amps use a regulated +/−15V. R1 and R2 divide the unregulated positive voltage and buffer the voltage through U1A (D). R8 and R10 divide the unregulated negative voltage and buffer the voltage through U1B (E). The oscillator outputs a square wave (A) and injects the signal into MOSFETs Q1 and Q2. The output of Q1 and Q2 (F) is a square wave at the same frequency of the oscillator and having an amplitude of the voltage difference between the outputs of U1A and U1B (D, E). The square wave (F) is capacitively coupled through C5 to the input of U2A. C2 and R5 create a low pass filter that converts the square wave (F) to a triangle wave (G). The amplitude of the triangle wave changes proportionally to change in the +/− unregulated voltage (B, C). The square wave output (F) may be input to multiple integrators (U2A) in multi-channel systems, where different mean amplitudes of the triangle wave are desired and all output stages are connected to the same voltage rails.

In applications where cost is a concern and performance may be degraded slightly, C4, R3, R6, D1, Q1 may be removed and R4 may be added. The value of R4 affects the quality of the square wave from the output (F), which in turn affects the quality of the triangle wave. For improved performance U2A may be replaced by a high speed op-amp such as LM6172.

Figure 3:
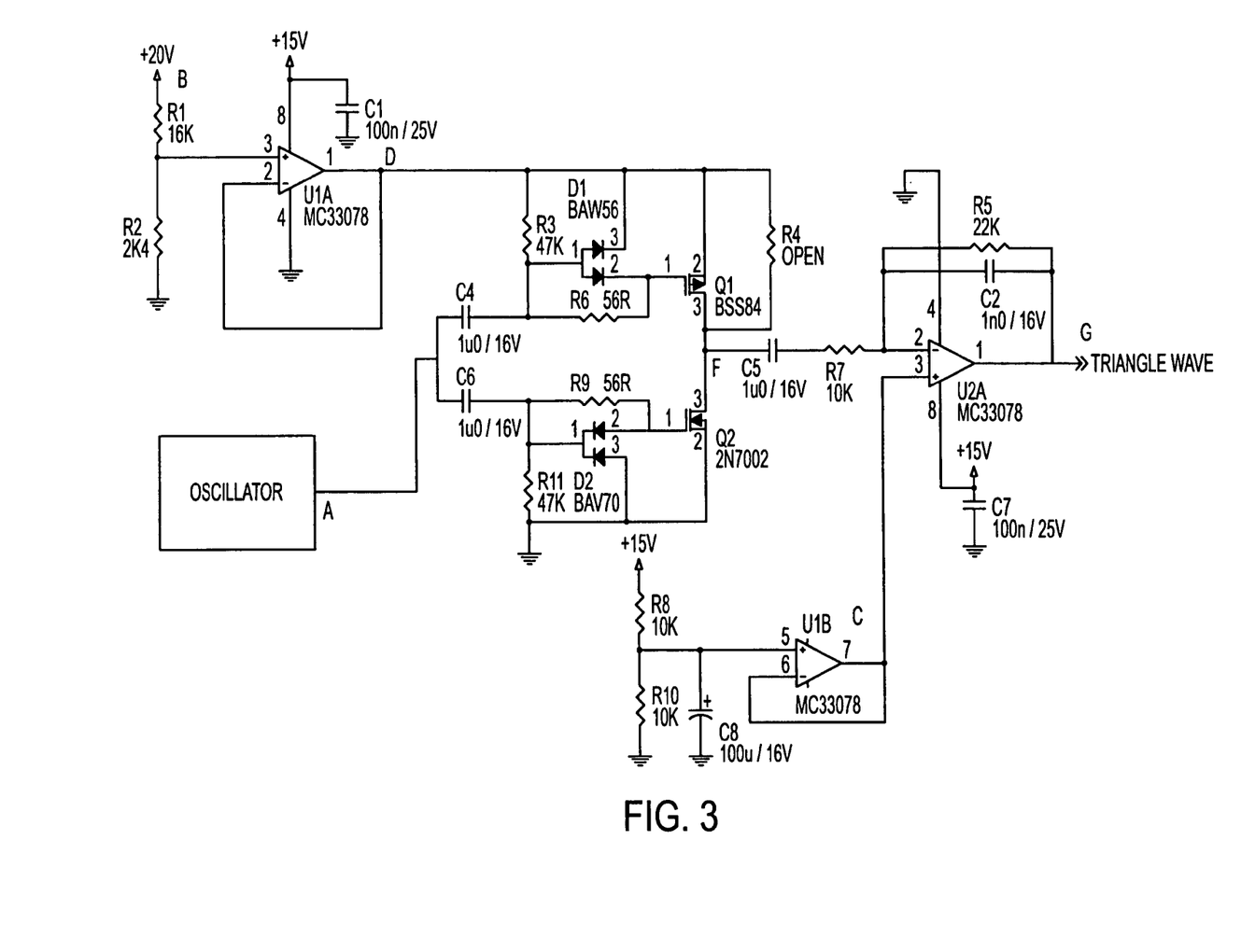
FIG. 3 is a circuit in an amplifier using only a positive voltage rail according to an embodiment of the present invention.

FIG. 3 illustrates an embodiment wherein an amplifier design uses only a positive voltage rail. In applications where cost is a concern and performance may be degraded slightly, C4, C6, R3, R6, R9, R11, D1, D2, Q1 may be removed and R4 may be added. Additionally, the gate of Q2 would be connected directly to oscillator output. The value of R4 effects the quality of the square wave from the output (F), which affects the quality of the triangle wave.

Figure 4:
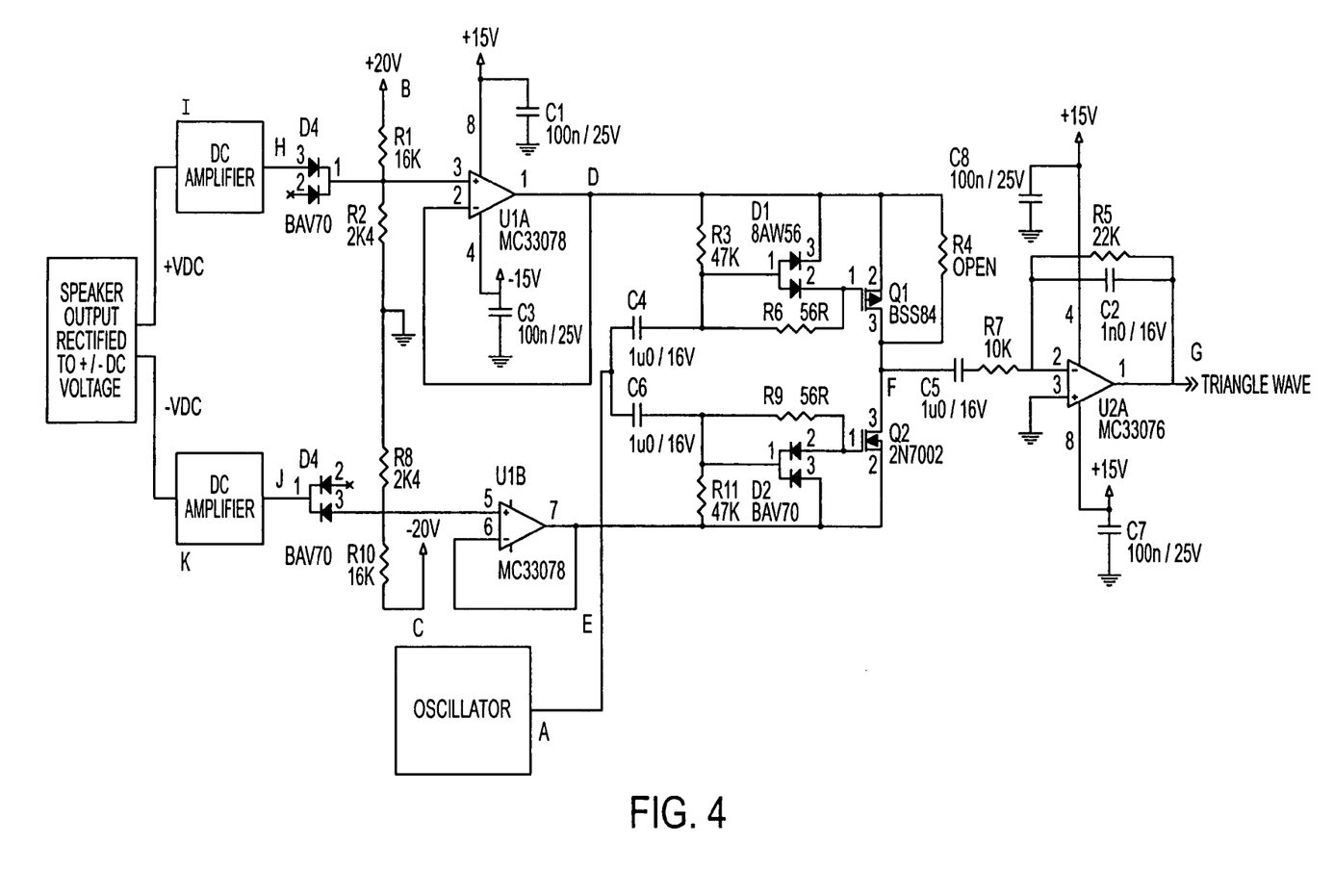
FIG. 4 is a circuit having a compressor according to an embodiment of the present invention.

Referring to FIG. 4, a circuit is provided which adds a compressor. The speaker output is rectified, producing +/− DC voltages proportionate to the output level. The +/− DC voltages pass through the DC amplifiers (I, K) so that different compression ratios can be achieved. As the output of the amplifier increases, the +/− DC amplified voltages (H, J) exceed the voltage set by the divider resistors (R1, R2 & R8, R10). As a result, the gain of the amplifier is reduced, thereby creating an automatic gain control circuit that does not introduce distortion.

Figure 5:
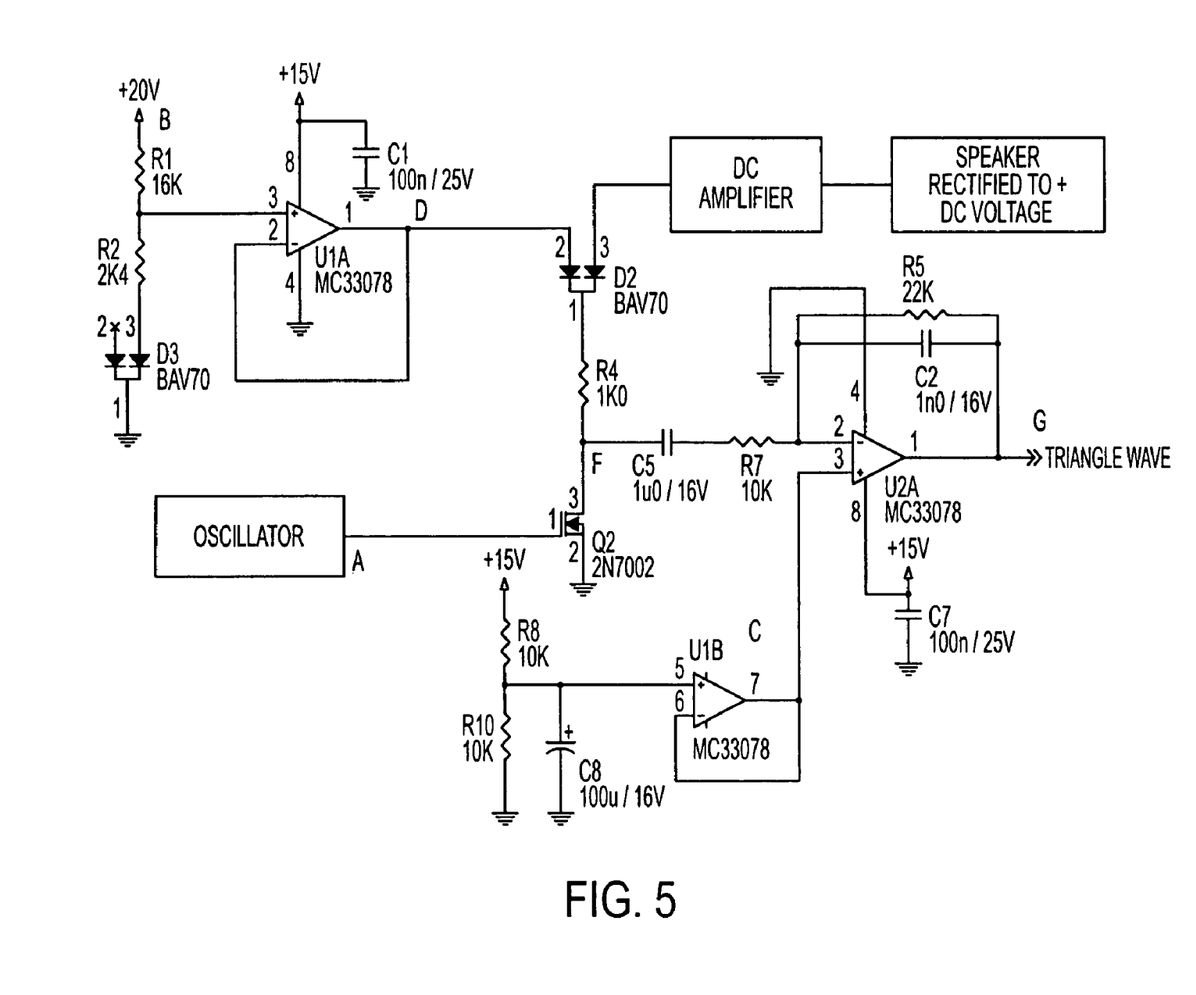
FIG. 5 is a circuit having a compressor in an amplifier that uses only a positive voltage rail according to an embodiment of the present invention.

Referring to FIG. 5, a circuit is shown which provides a compressor in an amplifier that uses only a positive supply rail. The circuit functions in much the same manner as described above with respect to FIG. 3. When using only a positive supply rail, the headroom in the op amps is reduced, which may reduce the dynamic range of the compressor. This may be overcome by a slight modification and reduction of integrity of the square wave at point F. The speaker output is rectified and the DC voltages amplified. However, the insertion point changes. The output of U1A (D) is limited by its supply voltage. The DC amplifier may supply the voltage directly to R4. Diode D2 is added to prevent U1A from sinking the voltage supplied from the DC amplifier. Diode D3 is added to compensate for the voltage drop across D2. If the op amp supply voltage limitations are a problem in the +/− power supply configuration, then similar modifications of the DC amplifier insertion point may be done.

Figure 6:
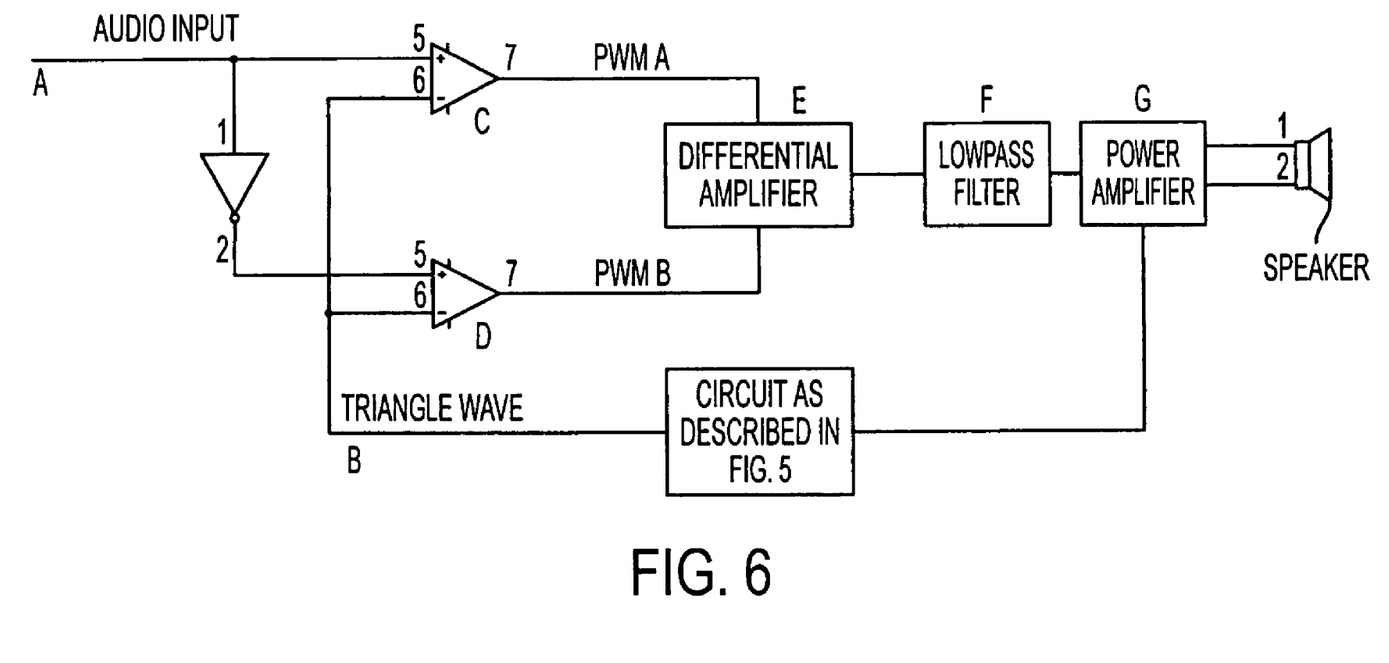
FIG. 6 is a circuit having a compressor in an amplifier according to an embodiment of the present invention.

Referring to FIG. 6, a circuit is used as a compressor in an amplifier that is not a class D amplifier. The audio input is similar to the embodiment shown in FIG. 1. However, comparator outputs (C, D) do not go to switching MOSFETs. Instead, the PWM signals (PWM A, PWM B) go to a differential amplifier (E). As a result, some of the switching frequency is removed in a manner similar to the LC filter in FIG. 1. Additionally, the audio signal is referenced to ground instead of balanced audio outputs. The signal then passes to a lowpass filter (F). The lowpass filter removes the remaining switching signal. In powered subwoofer applications, the lowpass filter can be tuned to be used as part of an active crossover network to help reduce cost. The signal next goes to a power amplifier (G). The power amplifier can be of any analog input topology. The audio output is then sent to the circuit, as exemplified in FIG. 5, and the resulting triangle wave (B) that changes based on output level is input to the comparators (C, D). The result is a compressor that can be used for signal processing.

Thus, various embodiments of the inventions have been described in detail above. In one embodiment, the circuit can be used to improve the power supply rejection of a pulse width modulated digital amplifier. In such embodiment, the pulse width modulated digital amplifier may be, e.g., a Class D amplifier. An operational amplifier preferably buffers power supply division references to ensure accurate low-impedance reference voltage. An oscillator provides an output having a 50% duty cycle. The oscillator is preferably a fixed oscillator. A voltage level translation of the fixed oscillator provides an output in frequency to the fixed oscillator, wherein the amplitude can vary between the set voltage references, which may include ground. At least one integrator is preferably provided to convert the varying amplitude square wave into a triangle wave.

In another embodiment, the circuit can be used as a compressor or as a limiter with a class D amplifier. The power supply rejection circuit as discussed above can be used. The audio output signal is rectified. The DC is amplified and injected into the power supply rejection circuit at the points described above.

In yet another embodiment, the power supply rejection circuit can be used as a compressor or as a limiter without a class D amplifier. The power supply rejection circuit as described above is used. The audio output signal is rectified. The DC is amplified and injected into the power supply rejection circuit as discussed above at described points. The pulse width modulated signals are inputted into a differential amplifier and a lowpass filter to restore the audio to the output.

While the invention has been particularly shown and described with reference to the preferred embodiments thereof, it will be understood by those skilled in the art that various changes in form and details may be made therein without departing from the spirit and scope of the invention.

What is claimed is:

1. A device for providing improved power supply rejection of a pulse width modulated digital amplifier, comprising:
    a buffering mechanism that buffers divided reference voltages;
    an oscillator which outputs a first waveform, wherein the first waveform can be combined with the divided reference voltages;
    a circuit that performs a voltage level translation, wherein the voltage level translation outputs a second waveform having a similar frequency to the first waveform, wherein the second waveform has an amplitude that varies between the divided reference voltages; and,
    an integrator that converts the second waveform into a triangle waveform that can be used with the pulse width modulated digital amplifier.

2. The device of claim 1, wherein the pulse width modulated digital amplifier is a Class D amplifier.

3. The device of claim 1, wherein the buffering mechanism is an operational amplifier.

4. The device of claim 1, wherein the buffering mechanism ensures an accurate low impedance voltage.

5. The device of claim 1, wherein the second waveform is a square waveform.

6. The device of claim 1, wherein the oscillator is a fixed oscillator.

7. The device of claim 1, wherein the first waveform has a 50% duty cycle.

8. The device of claim 1, wherein the divided reference voltages can include ground.

9. A device useful as a compressor or limiter with a Class D amplifier, comprising:
    means for rectifying an audio input signal;
    means for DC amplifying the audio input signal;

means for injecting the audio input signal into a circuit for providing improved power supply rejection, the circuit comprising:
- a buffering mechanism that buffers divided reference voltages;
- an oscillator which outputs a first waveform, wherein the first waveform can be combined with the divided reference voltages;
- a subcircuit that performs a voltage level translation, wherein the voltage level translation outputs a second waveform having a similar frequency to the first waveform, wherein the second waveform has an amplitude that varies between the divided reference voltages; and,
- an integrator that converts the second waveform into a triangle waveform that can be used with the pulse width modulated digital amplifier.

10. A device useful as a compressor or limiter, comprising:
- means for rectifying an audio input signal;
- means for DC amplifying the audio input signal;
- means for injecting the audio input signal into a circuit for providing improved power supply rejection, the circuit comprising:
  - a buffering mechanism that buffers divided reference voltages;
  - an oscillator which outputs a first waveform, wherein the first waveform can be combined with the divided reference voltages;
  - a subcircuit that performs a voltage level translation, wherein the voltage level translation outputs a second waveform having a similar frequency to the first waveform, wherein the second waveform has an amplitude that varies between the divided reference voltages;
  - an integrator that converts the second waveform into a triangle waveform;
- means for inputting pulse-width-modulated signals to a differential amplifier; and
- a lowpass filter to restore audio to the output.

* * * * *